United States Patent [19]

Tang

[11] 4,281,053
[45] Jul. 28, 1981

[54] MULTILAYER ORGANIC PHOTOVOLTAIC ELEMENTS

[75] Inventor: Ching W. Tang, Rochester, N.Y.

[73] Assignee: Eastman Kodak Company, Rochester, N.Y.

[21] Appl. No.: 119,328

[22] Filed: Feb. 7, 1980

Related U.S. Application Data

[60] Continuation-in-part of Ser. No. 5,636, Jan. 22, 1979, abandoned, which is a division of Ser. No. 907,361, May 18, 1978, Pat. No. 4,164,431, which is a continuation-in-part of Ser. No. 821,115, Aug. 2, 1977, abandoned.

[51] Int. Cl.³ .................. B32B 9/04; B32B 15/04; G05D 11/00; H01J 40/14
[52] U.S. Cl. .................. 430/58; 136/263; 250/211 R; 250/458; 252/501.1; 428/336; 428/411; 428/457; 430/61; 430/900; 430/66
[58] Field of Search .............. 428/411, 332, 336, 457; 252/501; 136/89 NB; 260/345.1; 250/458, 211 R; 430/66, 900, 58

[56] References Cited

U.S. PATENT DOCUMENTS

| | | | |
|---|---|---|---|
| 3,009,006 | 11/1961 | Kostelec | 136/89 NB |
| 3,009,981 | 11/1961 | Wildi et al. | 136/89 NB |
| 3,057,947 | 10/1962 | Calvin et al. | 136/89 NB |
| 3,507,706 | 4/1970 | Webb | 136/89 NB |
| 3,530,007 | 9/1970 | Golubovic | 136/89 NB |
| 3,591,374 | 7/1971 | Seus | 430/66 |
| 3,615,414 | 10/1971 | Light | 260/345.1 |
| 3,789,216 | 1/1974 | Komp | 250/211 R |
| 3,837,851 | 9/1974 | Shattuck et al. | 252/501 |
| 3,840,368 | 10/1974 | Ikeda et al. | 252/501 |
| 3,844,843 | 10/1974 | Kay et al. | 136/89 NB X |
| 3,895,944 | 7/1975 | Wiedemann et al. | 252/501 |
| 3,912,931 | 10/1975 | Gravlsso et al. | 250/458 |
| 3,935,031 | 1/1976 | Adler | 136/89 NB |
| 3,938,994 | 2/1976 | Reynolds et al. | 260/345.1 |
| 3,955,978 | 5/1976 | Rochlitz et al. | 252/501 X |
| 3,992,205 | 11/1976 | Wiedemann | 252/501 X |
| 3,996,049 | 12/1976 | Rochlitz | 252/501 X |
| 3,997,342 | 12/1976 | Bailey | 252/501 X |
| 4,106,951 | 8/1978 | Masi | 136/89 NB |
| 4,125,414 | 11/1978 | Tang et al. | 136/89 NB |
| 4,127,738 | 11/1978 | Ghosh et al. | 136/89 NB |

OTHER PUBLICATIONS

L. W. Davies, AWA Technical Review, vol. 15, No. 4, 1974, pp. 139–142.
IBM Technical Bulletin, 18(8), No. 2442, Jan. 1976, p. 14.
IBM Technical Bulletin, vol. 19, No. 1, Jun. 1976, pp. 367–368.
T. K. Mukherjee, Photocurrents & Photopotentials in Org. Solids, Conf. Record, IEEE Photospecialist Conf., Mar. '67, pp. 7–23.
Research Disclosure, Oct. 1977, pp. 71–73.
N. F. Yannoni, Solar Cells, 1971, Organic Materials Research, pp. 175–184.

*Primary Examiner*—Thomas J. Herbert, Jr.
*Attorney, Agent, or Firm*—Dana M. Schmidt

[57] ABSTRACT

A photoconductive laminate and its use are disclosed, the laminate comprising two layers of compounds, each layer being a single phase and at least one of the compounds having a generally planar polycyclic nucleus.

7 Claims, 1 Drawing Figure

FIG. 1

MULTILAYER ORGANIC PHOTOVOLTAIC ELEMENTS

RELATED APPLICATIONS

This application is a continuation-in-part application of U.S. Ser. No. 005,636, filed on Jan. 22, 1979, now abandoned. U.S. Ser. No. 005,636 in turn is a division of U.S. application Ser. No. 907,361, filed May 18, 1978, now U.S. Pat. No. 4,164,431, which is a continuation-in-part application of U.S. Ser. No. 821,115, filed on Aug. 2, 1977, now abandoned.

BACKGROUND OF THE INVENTION

1. Field of the Invention

This invention relates to photoconductive laminates found in photovoltaic elements useful for converting light and particularly for converting solar energy into electrical energy. The invention features the use of organic compounds.

2. State of the Prior Art

So-called Schottky barrier or P-N junction photocells rely upon the fact that a built-in potential exists at the metal/semiconductor interface as in the Schottky device or at the junction between the P-type and N-type semiconductors as in the P-N junction device. Electron-hole pairs generated by the absorption of light in the semiconductor are separated due to the built-in field at the interface, establishing an electrical potential.

Among chief materials used in the past for solar cells have been inorganic semiconductors, due to their fairly high conversion efficiencies which have been as high as 12 to 15 percent, for example, for silicon. However, such devices have proven to be very expensive to construct, due to the melt and other processing techniques necessary to fabricate the semiconductor layer. As a result, such devices have had extensive practical utility only in the field of space exploration, and not in terrestrial applications.

In an effort to reduce the cost of solar cells, organic photoconductors and semiconductors have been considered, due to their inexpensive formation by solvent coating and similar techniques. However, prior art organic materials have generally produced solar cells with conversion efficiencies only as high as about 0.05 percent at their highest, when exposed to incident sunlight at an intensity of 100 mW/cm$^2$. An example of such a material is crystal violet, as described, for example, in U.S. Pat. No. 3,844,843. Still higher efficiencies at least as high as 0.1 percent are desirable if the cells are to have practical terrestrial use, notwithstanding their inexpensive cost of manufacture. An efficiency of 0.3 percent was reported as being achieved through the use of an undisclosed dopant, as noted in "Prospects for Direct Conversion of Solar Energy to Electricity". AWA Technical Review, Volume 15, No. 4, 1974, footnote 3, but none of the materials used has been disclosed.

Solar cells utilizing other organic photoconductive materials are disclosed in U.S. Pat. Nos. 3,009,006; 3,057,947; 3,507,706; 3,530,007; and IBM Technical Disclosure Bulletin 18 (8), page 2442 (January 1976). However, there is no disclosure in any of these publications how to manufacture a solar cell which exhibits a conversion efficiency high enough for extensive practical terrestrial use, i.e., greater than about 0.1 percent.

Multilayer photoconductive compositions have been formulated in the past, for xerographic application, using porphyrinic compounds overlayered with a charge-transport layer, as disclosed, for example, in U.S. Pat. Nos. 3,895,944 and 3,992,205. However, such charge-transport layers in the U.S. Pat. No. 3,895,944 patent have required the use of binders, as well as sensitizers, and in the U.S. Pat. No. 3,992,205 patent the layer containing phthalocyanine requires the use of another pigment admixed therewith.

Phthalocyanine, a porphyrinic compound, has been used in organic solar cells in the past, in contact with a layer of electron acceptors such as oxidized tetramethyl p-phenylenediamine, β-carotene, dibrominated p-phenylenediamine, p-chloranil and the like. Examples are illustrated in U.S. Pat. No. 3,057,947. However, such cells have extremely low conversion efficiencies, less than 10$^{-7}$ percent (power output, col. 3, line 69, divided by 100 milliwatt input) for several reasons. First, the acceptors are not dyes and therefore do not absorb radiation in the visible spectrum as well as dyes do. Second, the layers are formed by pressing techniques and, as such, require thicknesses which are far too large for efficient solar cells.

Multilayer photoelectric cells have been constructed from a phthalocyanine layer with or without an overcoat of malachite green, as reported, for example, in *Topics in Current Chemistry*, Springer-Verlag, Volume 61, 1976, page 124, and U.S. Pat. No. 3,789,216, issued Jan. 29, 1974. However, the conversion efficiency of such cells were very low—less than 10$^{-4}$ percent, as reported in Springer-Verlag.

A layer of porphyrin or porphyrin-like material has also been used in the past to improve already existing solar cell semiconductors, such as selenium. Examples are disclosed in U.S. Pat. No. 3,935,031. However, only expensive inorganic semiconductors which themselves are self-sufficient cell materials have been suggested for such use with porphyrin.

Pyrylium and thiapyrylium dyes have been disclosed for use as sensitizers in photoconductive compositions, as noted, for example, in U.S. Pat. Nos. 3,938,994 and 3,997,342. No mention is made in these patents, however, as to the dye being useful with an adjacent layer of porphyrinic compound.

Other patents relating to the general background of organic solar cells include U.S. Pat. No. 3,912,931, issued Oct. 14, 1975.

Other patents relating to the general background of photoconductor compositions having a charge generating layer and a separate layer including a charge transport compound include U.S. Pat. Nos. 3,591,374, issued July 6, 1971; 3,837,851, issued Sept. 24, 1974; 3,840,368, issued Oct. 8, 1974; 3,996,049, issued Dec. 7, 1976; and 3,955,978, issued May 11, 1976.

RELATED PATENTS

U.S. Pat. No. 4,125,414, issued on Nov. 14, 1978, entitled "Organic Photovoltaic Elements", discloses elements comprising an organic photoconductive layer which includes pyrylium-type dyes together with a binder and a photoconductor. A preferred method of making such a composition features the formation of a discrete discontinuous phase is a continuous phase. A very thin nucleating layer of copper phthalocyanine can also be used with this photoconductive layer, but it does not form a rectifying junction.

OBJECTS OF THE INVENTION

It is an object of the invention to provide an organic solar cell using a multilayer organic composition, such a cell having improved conversion efficiencies.

It is another object of the invention to provide certain novel multilayer organic photoconductive laminates.

It is a related object of the invention to provide a photoconductive laminate which is both inexpensive to produce and sufficiently efficient as to be useful in photoconductive applications.

Other objects and advantages will become apparent upon reference to the following Summary and Description of the Preferred Embodiments, when read in light of the attached Drawing.

SUMMARY OF THE INVENTION

The invention concerns photoconductive laminates useful in solar cells.

More specifically, there is provided in one aspect of the invention, a multilayer photoconductive laminate comprising a single-phase layer of an organic electron donor compound containing a generally planar polycyclic nucleus, and in contact with said layer, a single-phase layer of a photoconductive organic dye having the structure:

wherein:
J is or N;

$D^1$ and $D^2$ are the same or different and are each the non-metallic atoms necessary to complete a heterocyclic 6-membered ring containing O, S, or Se as a ring atom;

$R^8$, $R^9$ and $R^{10}$ are the same or different and are each H, alkyl from 1 to about 3 carbon atoms, aryl, cyano or nitro;

$R^1$, $R^2$, $R^3$ and $R^4$ are the same or different and are each phenyl, or alkyl or alkoxy containing from 1 to about 5 carbon atoms, at least two of $R^1$, $R^2$, $R^3$ and $R^4$ being phenyl;

m is 1 or 0 and is 0 if J is N;
and $Z^\ominus$ is an anion.

In another aspect of the invention there is provided such a laminate of a single-phase layer of an organic electron donor compound and a single phase layer of a photoconductive organic dye, wherein the dye has the structure in which $R^5$ and $R^6$ are the same or different and are each alkyl from 1 to about 6 carbon atoms, phenyl, or a 5- or 6-membered heterocyclic ring;

$R^7$ represents an alkylamino-substituted phenyl or an alkylamino-substituted 5- or 6-membered heterocyclic ring having from 1 to about 6 carbon atoms in the alkyl moiety;

X is oxygen, selenium or sulfur; and
$Z^{8\ominus}$ is an anion.

DESCRIPTION OF THE PREFERRED EMBODIMENTS

Although the invention is hereinafter described in terms of its preferred embodiment, photovoltaic elements or solar cells, it is not limited thereto. Rather, the composition of the invention which makes such solar cells possible can also be used in a photoconductive mode or environment other than solar cells, for example, in a photodiode or as a photoconductive element in an electrophotographic imaging process. In such other environments, the thicknesses of the layers can vary from that desirable for solar cells, depending on the particular use. Also, only one electrode need be disposed in ohmic contact, in most photoconductive uses.

As used herein, "photovoltaic element" or "cell" means a solid state device which converts radiation absorbed by the element, directly to electric power. A photovoltaic element of this invention is suitable as a terrestrial rooftop generator or as a light-level measuring device. As a light-level measuring device, the cell can be used both at high and low light levels. The cell exhibits a moderately high open circuit voltage of about 300–500 mV.

Alternatively, the cell can also be used in the current mode. The current generated in a diffuse room-light condition is about 40 $\mu A/cm^2$, a large enough current to be measured accurately. The current can thus become a measure of the light intensity, and the calibrated cell can be used as an exposure meter and find application in cameras.

In accordance with one aspect of the invention, organic solar cells are provided with conversion efficiencies heretofore unattainable, that is, at least about 0.02% and as high as 1%. Such high conversion efficiencies mean that the quantum efficiency of the photoconductive laminate of the cell is also high, namely at least about 0.7%. This is achieved by the use of a single-phase layer of an organic electron donor material in contact with a single-phase layer of an organic electron acceptor material, each of which comprises a compound with a generally planar polycyclic nucleus. Together the layers have a combined thickness that does not exceed about 0.5 microns.

As is well known, the quantum efficiency is a photoconductive property calculatable from the photocurrent under a short-circuited condition and the amount of incident light.

The terms "electron donor" and "electron acceptor" are used to describe the respective materials' electron affinity, particularly when the materials are considered as a pair. Thus, an electron donor material, hereinafter "donor material", has a relative low electron affinity, and an electron acceptor, hereinafter "acceptor material", has a relatively high electron affinity. As such, a donor material tends to act as a p-type material whereas an acceptor material tends to act as an n-type material. The two materials when layered together form a rectifying junction between them, and at least one of them is capable of absorbing light at wavelengths between about 350 and about 1000 nm.

As used herein, a rectifying junction is one that provides a ratio of forward current to reverse current of at least about 10 when the element or cell is biased by at least 0.5 v. "Polycyclic" is used in its broadest context to include both a plurality of unfused rings as well as a plurality of fused rings.

Any organic donor and acceptor material with a generally planar, polycyclic nucleus can comprise one of the two respective contacting layers as long as such material has the afore-described characteristics and permits the formation of a solar cell with a conversion efficiency of at least 0.02% when exposed to simulated AM2 sunlight. The general planarity of the compounds' nuclei provides several desirable characteristics. First, it insures that cells made from coatings of these compounds will be generally free from shorts due to pinholes in the coatings. That is, such compounds, when coated, deposit as flat, overlying molecules in a single phase. Second, the planarity of the compounds' nuclei provides minimum resistance to charge transport through the two layers of the compounds, and therefore provides a maximum $I_{sc}$.

In one preferred embodiment of the invention, the generally planar polycyclic nuclei of the compounds are highly conjugated with Pi-electrons and have a large surface area. Generally, the larger the molecular surface area of such compounds, the more likely it is that the compounds will provide a cell with high conversion efficiencies. It is thought that this greater area provides greater assurance of molecular overlap in the layer formed, and less likelihood of pinhole shorts. Particularly useful examples of such compounds containing large-surface areas are those having a surface area in the plane of the compound on one side of the compound of at least 40 square angstroms and a width (in the plane) of at least about 5 Å.

As noted, one of the two contacting layers of the solar cell of the invention comprises a material that is donor-like, and the other a material that is acceptor-like. Each layer can comprise just one compound from that type only, or a mixture of that type only.

Examples of such donor compounds with generally planar, fused polycyclic nuclei include phthalocyanine and porphyrinic compounds. Any such porphyrinic compound is operative, with or without metal, and any metal will work, such as cobalt, magnesium, zinc, palladium, nickel, copper, lead, and platinum. However, some metal phthalocyanines are preferred because of the greater conversion efficiencies which they exhibit. Examples of preferred metal phthalocyanines include copper, lead, and platinum phthalocyanine. For example, lead phthalocyanine has produced a cell with a spectral response extending to almost 1000 nm. Further, it is preferred that the porphyrinic layer be structureless or microcrystalline, as large crystals in the film may tend to provide a shorting path which can render the element inefficient.

As used herein, a porphyrinic compound is any compound, natural or synthetic which derives from or includes the basic porphyrin structure. Examples of such are disclosed in the aforesaid U.S. Pat. No. 3,935,031, the details of which are expressly incorporated herein by reference. A currently preferred class of such compounds is the class having the structure wherein:

M is a metal;

$T^1$ and $T^2$ are both S or both C, or one of $T^1$ and $T^2$ is N and the other C;

$X^1$ and $X^2$ are the same or different, and are each hydrogen or halogen, such as chlorine, fluorine, bromine and the like; and

$Z^1$ is the nuclear carbon atoms necessary to form a six-membered unsaturated ring.

A further option is to provide the compounds with the structure of (I), but in a nonmetallic complex, whereby two of the four nitrogens become hydrogenated.

It has been discovered further that the layer of donor materials can be divided into two contiguous layers of different phthalocyanines only one of which contacts the layer of acceptor material, the other of which, in the case of a solar cell, is in ohmic contact with the electrode for the phthalocyanine. In such a case, the total thickness of the two layers of phthalocyanine considered together should equal the thickness that would be used for a single phthalocyanine layer.

Still other examples of useful donor compounds with generally planar, fused polycyclic nuclei include those containing at least 8 carbocyclic fused rings. Examples include ovalene, diindeno[1,2,3-cd-1',2',3'-1m]perylene, violanthrene, isoviolanthrene, and pyranthrene.

Examples of useful acceptor compounds with generally planar, fused polycyclic nuclei include those having the structure:

wherein $Z^2$ and $Z^3$ together comprise from about 12 to about 32 nonmetallic atoms necessary to complete between about 5 and about 10 fused aromatic or heterocyclic rings, $Z^4$ and $Z^5$ are the same of different, and each comprise from 2 to 8 nonmetallic atoms necessary to complete 1 or 2 fused aromatic or heterocyclic rings.

$R^1$ through $R^6$, and $G^1$ and $G^2$ are the same or different and are each H; an electron-withdrawing group such as keto, cyano, halide such as chloride, bromide and the like, sulfonyl, carboxy, nitro and the like; imino; alkyl or alkoxy containing from 1 to 5 carbon atoms, for example, methyl, ethyl, propyl, hydroxyl; amino; aryl containing from 6 to 10 carbon ring atoms, e.g., phenyl, naphthyl; or together, $R^1$ and $R^2$ or $R^5$ and $R^6$ can comprise 4–8 nonmetallic atoms necessary to complete one or two aromatic rings; provided that at least one of $R^1$ through $R^6$ and $G^1$ and $G^2$ is an electron-withdrawing group. As used herein, "alkyl" and "aryl" include substituted alkyl, such as hydroxypropyl, methoxy, ethoxy, butoxy, and the like; and substituted aryl, respectively, such as phenol, halophenyl, alkoxyphenyl, alkylphenyl, and the like.

Representative examples of fused polycyclic compounds having the structure noted are anthraquinone vat pigments such as flavanthrone, perylene derivatives, coronone-imide derivatives, ovalene derivatives, and compounds of the structure wherein E is O or S.

For example, the following perylene derivatives are particularly useful:

wherein $R^7$ and $R^8$ are the same or different and are each hydrogen, alkyl containing from 1 to 5 carbon atoms, such as methyl, ethyl, propyl, hydroxypropyl and the like; phenyl such as p-chlorophenyl, p-alkoxyphenyl, p-methylphenyl and the like; or quinolyl; and $R^9$, $R^{10}$, $R^{11}$, and $R^{12}$ are each =O; or $R^7$ and one of $R^9$ and $R^{10}$, and $R^8$ and one of $R^{11}$ and $R^{12}$ together comprise from 7 to 8 non-metallic atoms necessary to form one or two fused carbocyclic or heterocyclic rings, in which case the other of $R^9$ and $R^{10}$ and the other of $R^{11}$ and $R^{12}$ is =O. For example, included in A are Other useful examples of acceptor materials include those in which the polycyclic rings are not fused. Particularly useful examples are photoconductive organic dyes such as pyrylium-type dye salts which include pyrylium, thiapyrylium and selenapyrylium dye salts, and also salts of the aforementioned pyrylium-type dye salts containing condensed ring systems such as salts of benzopyrylium and naphthopyrylium dyes. Highly preferred examples having a generally planar nucleus, a surface area of at least 40 square angstroms and a width in the plane of at least 5 A, are those with the structure:

wherein:

J is or N;

$D^1$ and $D^2$ are the same or different and are each the non-metallic atoms necessary to complete a heterocyclic 6-membered ring containing O, S or Se as a ring atom;

$R^8$, $R^9$ and $R^{10}$ are the same or different and are each hydrogen; alkyl from 1 to about 3 carbon atoms such as methyl, ethyl, isopropyl and the like; aryl such as phenyl and naphthyl and including substituted aryl; cyano or nitro;

R¹, R², R³ and R⁴ are the same or different and are each phenyl, including substituted phenyl, or alkyl or alkoxy containing from 1 to about 5 carbon atoms, such as methyl, ethyl, isopropyl, methoxy, propoxy and the like, at least two of R¹, R², R³ and R⁴ being phenyl; m is 1 or 0 and is 0 if J is N:

and $Z^\ominus$ is an anionic moiety, such as perchlorate, fluoroborate, and the like.

If R¹, R², R³ or R⁴ are substituted phenyl, it is preferred that the substituents be located in the para position and be selected from among those which shift the blue absorption peak of the dye to a longer wavelength. Useful examples of such substituents include alkyl from 1 to 3 carbon atoms and halogens such as chlorine, fluorine and the like.

Dyes of structure (II) above include the following subgeneric structures:

wherein Q and X are the same or different and are each O, S, or Se. The dyes of structure (II) can be manufactured by any convenient method. For example, the process disclosed in *Helvetica Chemica Acta*, Volume 49, Fasciculus 7, 1966, No. 244, pages 2046 through 2049 can be used.

It is contemplated that another class of useful acceptor polycyclic compounds of the unfused type is 2,4,6-trisubstituted pyrylium and thiapyrylium dye salts of the general structure:

in which R⁵ and R⁶ are the same or different and are each alkyl from 1 to about 6 carbon atoms, such as methyl, ethyl, isopropyl and the like; phenyl, including substituted phenyl; or a 5- or 6-membered heterocyclic ring, such as thienyl, furyl, pyridyl, pyrimidinyl, thiadiazolyl or thiazolyl or pyrrolyl; R⁷ represents an alkylamino-substituted phenyl or an alkylamino-substituted 5- or 6-membered heterocyclic ring having from 1 to about 6 carbon atoms in the alkyl moiety including dialkylamino-substituted and halogenated alkylamino-substituted phenyl dialkylaminopyridyl, dialkylaminofuryl, dialkylaminothienyl, dialkylaminopyrimidinyl, dialkylaminothiadiazolyl or dialkylaminothiazolyl; X is oxygen, selenium or sulfur and $Z^{8\ominus}$ is an anion such as perchlorate, fluoroborate, and the like. Examples of such compounds, particularly wherein at least one of R⁵, R⁶ and R⁷ is heterocyclic, are described and claimed in commonly owned U.S. Application Ser. No. 711,046, filed Aug. 2, 1976, by D. P. Specht et al, entitled "Sensitizers for Photoconductive Compositions", and in *Research Disclosure*, Volume 157, May 1977, Publication No. 15742, published by Industrial Opportunities, Limited, Homewell, Havant, Hampshire, PO9 1EF, United Kingdom, the details of which are expressly incorporated herein by reference.

Yet another useful class of pyrylium type dyes are disclosed in commonly-owned U.S. Application Ser. No. 813,371 filed on July 6, 1977, entitled "Novel Radiation Sensitive Compounds and Radiation Sensitive Compositions Containing the Same" by M. Petropoulos et al.

Representative useful dyes having structures of the type (II) or (III) described above include:

4-[(2,6-diphenyl-4H-thiapyran-4-ylidene)methyl]-2,6-diphenylthiapyrylium perchlorate, 4-[(2,6-dimethoxy-4H-thiapyran-4-ylidene)methyl]-2,6-diphenylthiapyrylium perchlorate, 4-[(2,6-diphenyl-4H-pyran-4-ylidene)methyl]-2,6-diphenylthiapyrylium perchlorate, 4-[(2,6-diphenyl-4H-pyran-4-ylidene)methyl]-2,6-diphenylpyrylium fluoroborate, 4-[(2,6-diphenyl-4H-thiapyran-4-ylidene)methyl]-2,6-diphenylselenapyrylium perchlorate, 4-[(2,6-diphenyl-4H-selenin-4-ylidene)methyl]-2,6-diphenylselenapyrylium perchlorate, 4-[(2,6-diphenyl-4H-pyran-4-ylidene)methyl]-2,6-diphenylselenapyrylium perchlorate, 4-[(2,6-diethyl-4H-thiapyran-4-ylidene)methyl]-2,6-diphenylthiapyrylium perchlorate, 4-[(2,6-diphenyl-4H-thiapyran-4-ylidene)methyl]-2,6-diethoxythiapyrylium perchlorate, 2,6-diphenyl-4-[(-2,6-diphenyl-4H-pyranylidene)amino]-pyrylium perchlorate, 2,6-diphenyl-4-(4-dimethylaminophenyl)-thiapyrylium hexafluorophosphate, 2,6-diphenyl-4-(4-diphenylaminophenyl)-thiapyrylium perchlorate, 2,6-diphenyl-4-(4-dipropylaminophenyl)thiapyrylium perchlorate, 4-{[2,6-di(p-methylphenyl)-4H-thiapyran-4-ylidene]-methyl}-2,6-diphenylthiapyrylium perchlorate, 4-{[2,6-di(p-fluorophenyl)-4H-thiapyran-4-ylidene]-methyl}-2,6-diphenylthiapyrylium perchlorate, 4-{[2,6-di(p-fluorophenyl)-4H-thiapyran-4-ylidene]-methyl}-2,6-di(p-fluorophenyl)thiapyrylium perchlorate, 4-{[2,6-di(p-methylphenyl)-4H-thiapyran-4-ylidene]-methyl}-2,6-di(p-methylphenyl)thiapyrylium perchlorate.

The layer of acceptor material can comprise a mixture of two different dyes of structure (II), or a dye of structure (II) with a dye of structure (III), in contact with the donor material layer. In fact, in some instances synergism has been demonstrated in that the conversion efficiency of the mixture exceeds that obtainable from using either one of the dyes above, presumably because the dyes complement each other in the mixture.

Two layers of different or the same acceptors also may be used in place of a single layer of acceptor. For example, by sequential evaporation, two compounds of structure A can be used to provide two distinct layers of acceptors, one layer of which contacts a porphorinic donor layer to form a multilayer cell.

In addition to the materials described, other materials, compounds, compositions, and the like can be added, provided that they do not significantly decrease the conversion efficiency of the cell, prevent the layer from forming a rectifying contact with the layer of donor material, or create sinks for the light-generated carriers.

The thickness of the total composition comprising the combined layers of donor and acceptor materials is an important aspect of the photovoltaic elements of the invention, at least if maximum conversion efficiencies are desired. It has been found that efficiencies begin to decrease drastically for a thickness in excess of about 0.5 microns, apparently due to failure of the light to penetrate to the region adjacent the rectifying junction or to increased series resistance. Minimum thickness for the individual layers appears to be dictated more by coating techniques and the minimum that can be used without shorting. Useful devices of improved efficiency have been constructed with thicknesses for each of the two layers as low as about 100 Å.

Greater thicknesses can be used for other photoconductive uses or embodiments. For example, electrophotographic applications require much thicker layers, e.g., 10 microns, as is well known.

Currently preferred thicknesses for each of the two layers, for optimum solar cell results, are about 300 to 500 Å. If unequal thicknesses are to be used, it is preferred that the thinner layer be adjacent the window electrode, described hereinafter, to permit proper illumination of the rectifying junction.

For a solar cell or photovoltaic element of the type described, electrodes are operatively connected, one to the donor-layer and the other to the acceptor layer. Although the most common, and preferred, construction is one in which the electrodes are in physical contact with their respective layers, this need not always be the case. For example, the donor layer which contributes to the formation of the rectifying junction can be spaced away from its electrode by a layer of a different compound as described above for the porphyrinic materials.

The electrodes for the cell are each selected to form an operative ohmic contact with an adjacent layer. As used herein, "operative" means connected in a manner that does not short the cell and, as is conventional, is of a material which permits at least one of the electrodes to be a window electrode. That is, at least one of the electrodes is semitransparent to useful light. "Ohmic contact" means a low impedance contact with the adjacent layer, of no more than about 1000 ohms/cm$^2$ impedance. Because the interface between the organic materials provides the necessary rectifying junction, the electrode materials are selected to provide ohmic contacts as defined above. The electrode adjacent to the donor layer preferably has a high work function, while the one adjacent to the acceptor layer preferably has a low work function.

It has been found that a useful material for the electrode adjacent to the donor layer is a glass or a transparent film such as poly(ethylene terephthalate) coated with a semitransparent layer of indium tin oxide, tin oxide, or nickel. This material not only has a high work function, but its semitransparency makes it highly useful as the window electrode. Examples of such materials having a glass support are Nesa ® and Nesatron ® glass manufactured by PPG Industries and having a sheet resistance of about 10 to 50 ohms/square and an optical transmittance of about 80 percent, for visible light.

The opposite electrode can be metal with a low work function, such as indium, silver, tin, aluminum or the like, and can be semitransparent or opaque. Silver is a preferred electrode for minimum loss in conversion efficiency upon aging.

Figure 1:
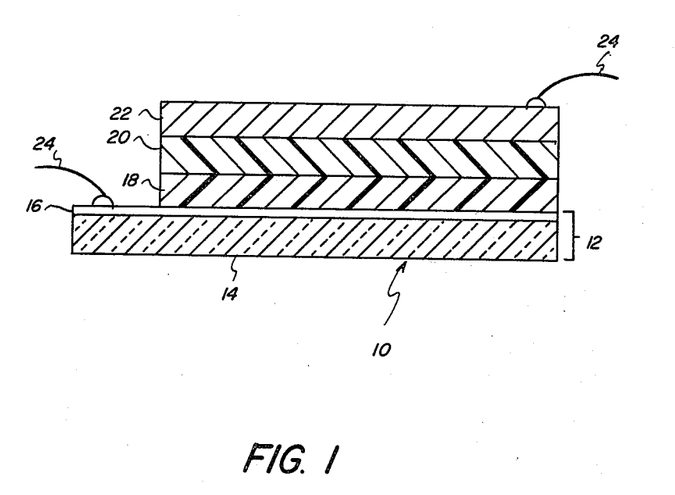
The FIGURE is a sectional view, partly schematic, of a cell constructed in accordance with the invention.

As shown in the Figure, such a photovoltaic cell as described above comprises a laminar array 10 of a window electrode 12 comprising a transparent support 14 and a semitransparent layer 16 of indium tin oxide, tin oxide or nickel; a layer 18 of a donor compound, such as phthalocyanine that is metal free or metallic; a layer 20 of an acceptor compound; and an electrode 22 of a metal having a sufficient work function as to form an ohmic contact with layer 20. It will be appreciated that the dimensions of the FIGURE have been exaggerated for clarity. Preferred thicknesses for the layers comprise, for layer 16, 0.5 microns to about 5 microns; for layer 18, 100 to 2500 Å; for layer 20, 100 to 2500 Å; and for electrode 22, 100 to 2,000 Å. As noted above, in preferred constructions the combined thicknesses of layers 18 and 20 do not exceed about 0.5 micron, for maximum efficiencies.

Wires 24 represent leads contacting the electrodes to connect the cell to a load circuit, as is conventional.

Such photovoltaic elements constructed from the materials described above have been found to produce markedly superior conversion efficiencies, at least as much as about 0.02 percent when exposed to sunlight, and even as high as 1.0 percent.

Any suitable coating technique can be used to manufacture the photoconductive laminate and/or solar cell. For example, any coating technique can be used wherein the two layers forming the rectifying junction are coated from two different solvents, one upon the other, the solvent of one being a poor solvent for the other. In this manner, a well-defined interface between the two layers will be maintained. An alternative and highly preferred method is to vapor deposit the porphyrinic layer on a clean, i.e., polished, window electrode, using sources of porphyrinic compounds which are reasonably free of decomposable or volatile materials, and thereafter solvent coat the dye layer as by spin coating at between about 1,000 and about 10,000 rpm from one or more of the following solvents: 1,2-dichloroethane, dichloromethane, and mixtures of the two. For pyrylium dyes, a particularly useful solvent mixture has been, by weight percent, 49% 1,2-dichloroethane, 49% dichloromethane; and 2 percent 1,1,1,3,3,3-hexafluoroisopropyl alcohol. Another preferred method is to deposit the two layers forming the rectifying junction by vapor deposition. This method is particularly useful for the polycyclic, perylene-type derivative acceptors. A currently preferred process for polishing the Nesatron ® glass, if used as the window electrode, comprises rubbing the Nesatron ® surface with a cotton flannel wetted with a suspension of an alumina or other abrasive, or by polishing in a spinning disc, usually for a few minutes. The polished Nesatron ® glass was then sonicated in a 1:1 H₂O/isopropyl alcohol bath for about half an hour to remove the abrasive particles, and then rinsed thoroughly with distilled water. The polished Nesatron ® glass appears relatively clean in a strong light.

The electrode for the dye layer can be applied by conventional vapor deposition.

EXAMPLES

The following examples further illustrate the nature of the invention. In each case, a modified Kodak 600 slide projector, together with appropriate glass filters and a water filter, was used to provide a simulated AM2 sunlight, as defined in H. J. Hovel, "Solar Cells", 1975. The light incident on the cell had an intensity of 75 mW/cm² which was calibrated against a standard silicon cell having a short-circuit current output of 21.5 mA/cm² at 75 mW/cm², AM2. The current-voltage characteristics of each cell were traced by applying an external voltage to the cell in either polarity. The voltage across the cell and the current through it (measured by a Keithley 602 multimeter) were simultaneously traced by an x-y recorder.

EXAMPLE 1

A cell as shown in the FIGURE was fabricated in the following manner:

(a) A piece of Nesatron ® glass about 1 inch by 1 inch was polished and thoroughly cleaned.

(b) A 400 Å thick copper-phthalocyanine film was deposited on the Nesatron ® glass by vapor sublimation in a 1×10⁻⁵ torr vacuum.

(c) A 400 Å thick layer of a photoconductive dye, 4-[(2,6-diphenyl-4H-thiapyran-4-ylidene)methyl]-2,6-diphenylthiapyrylium perchlorate, was spin-coated on top of the copper phthalocyanine layer. This dye film appeared to be homogeneous and very uniform.

(d) The top electrode, indium, was evaporated on top of the two-layer organic component to complete the cell structure.

Under the simulated AM2 illumination described above (75 mW/cm²), the cell developed an open-circuit voltage of 0.36 volt, a short-circuit current of 2 mA/cm², and a fill factor of 0.47. The power conversion efficiency was 0.45 percent and the quantum efficiency was 8.3%.

EXAMPLES 2 THROUGH 7

A class of dyes having the formula:

wherein φ is phenyl, and X and Q are any two of the three elements O, S, Se, was tested as the photoconductive material in a solar cell prepared as described for Example 1. The Cu-phthalocyanine layer deposited by vapor sublimation was about 300 to 500 Å thick, and the dye layer deposited on the Cu-phthalocyanine by spin-coating was also about 300 to 500 Å. Table I lists the photovoltaic output of the cells when tested under simulated Air-Mass-2 illumination.

TABLE I

| Example | Dye Q | Dye X | Voc (volts) | Isc (mA/cm²) | Conversion Efficiency, % | Quantum Efficiency, % |
|---|---|---|---|---|---|---|
| 2 | O | O | 0.55 | 0.9 | 0.29 | 3.7 |
| 3 | O | S | 0.45 | 1.6 | 0.43 | 6.6 |
| 4 | S | S | 0.36 | 2.0 | 0.45 | 8.3 |
| 5 | S | Se | 0.31 | 1.5 | 0.28 | 6.2 |
| 6 | Se | Se | 0.24 | 2.0 | 0.28 | 8.3 |
| 7 | O | Se | 0.42 | 0.4 | 0.10 | 1.7 |

EXAMPLES 8 THROUGH 11

A class of dyes having the formula:

wherein $R^{12}$ and $R^{13}$ are para substituents selected from H, CH₃, F, were tested as described in Example 1 in a photovoltaic cell of the configuration described in Example 1. Table II lists the output of these cells.

TABLE II

| Example | Dye | Voc (volts) | Isc (mA/cm²) | Conversion Efficiency, % | Quantum Eff., % |
|---|---|---|---|---|---|
| 8 | $R^{12}$ = H, $R^{13}$ = CH₃ | 0.33 | 1.75 | 0.31 | 7.3 |
| 9 | $R^{12}$ = H, $R^{13}$ = F | 0.30 | 2.15 | 0.35 | 9.0 |
| 10 | $R^{12}$ = $R^{13}$ = F | 0.20 | 1.6 | 0.17 | 6.6 |
| 11 | $R^{12}$ = $R^{13}$ = CH₃ | 0.40 | 1.3 | 0.28 | 5.6 |

EXAMPLES 12 THROUGH 19

Metal-free phthalocyanine and a number of metal-phthalocyanines were used in a photovoltaic cell of the configuration described in Example 1. Phthalocyanine films of thickness ranging from 300 to 500 Å were deposited on clean Nesatron ® glass, and a 400 to 500 Å thick film of 4-[(2,6-diphenyl-4H-thiapyran-4-ylidene)-methyl]-2,6-diphenylthiapyrylium perchlorate was deposited on top of each phthalocyanine film by spin-coating. Indium was used as the top electrode. Table III lists the output of these cells comprising various phthalocyanine layers.

TABLE III

| Example | Phthalocyanine | Voc (volts) | Isc (mA/cm²) | Conversion Efficiency, % | Quantum Eff., % |
|---|---|---|---|---|---|
| 12 | Metal-free | 0.25 | 0.18 | 0.02 | .74 |
| 13 | Co | 0.20 | 0.35 | 0.03 | 1.4 |
| 14 | Ni | 0.25 | 0.80 | 0.09 | 3.3 |
| 15 | Cu | 0.36 | 2.00 | 0.45 | 8.3 |
| 16 | Zn | 0.36 | 1.10 | 0.14 | 4.6 |
| 17 | Pb | 0.35 | 3.50 | 0.50 | 14.5 |
| 18 | Pd | 0.42 | 0.75 | 0.14 | 3.1 |
| 19 | Pt | 0.38 | 1.25 | 0.21 | 5.2 |

EXAMPLE 20

A mixture of photoconductive dyes was used in the photovoltaic cell of the configuration described in Example 1. A 400 to 500 Å thick Cu-phthalocyanine film was deposited on clean Nesatron® glass by vapor sublimation. Then a 400 to 500 Å thick film, containing a 1:1 mixture of 4-[(2,6-diphenyl-4H-pyran-4-ylidene)-methyl]-2,6-diphenylpyrylium perchlorate and 4-[(2,6-diphenyl-4H-thiapyran-4-ylidene)methyl]-2,6-diphenyl-thiapyrylium perchlorate, was spin-coated on top of the Cu-phthalocyanine layer. Indium was the top electrode. Under simulated Air-Mass-2 illumination, the cell developed an open-circuit voltage of 0.43 volt, a short-circuit current of 2 mA/cm², and a fill factor of 0.44, giving a power conversion efficiency of 0.5 percent and a quantum efficiency of 8.3%.

EXAMPLE 21

Example 20 was repeated, except that the mixture of dyes comprised a 1:1 mixture of 4-[(2,6-diphenyl-4H-thiapyran-4-ylidene)methyl]-2,6-diphenylthiapyrylium perchlorate and 2,6-diphenyl-4-(4-dimethylamino-phenyl)thiapyrylium perchlorate. The conversion efficiency was found to be about 0.5 percent.

EXAMPLE 22

In a cell configuration as described in Example 1, Nesatron® glass/copper-phthalocyanine (400 Å)/photoconductive dye/Ag, where the photoconductive dye was a 400 to 500 Å film of 4-[(2,6-diphenyl-4H-thiapyran-4-ylidene)methyl]-2,6-diphenylthiapyrylium perchlorate and where silver was used as the top electrode, the cell developed an open-circuit voltage of 0.38 volt, a short-circuit current of 1.8 mA/cm² and a fill factor of 0.4, giving a conversion efficiency of 0.36 percent and a quantum efficiency of 7.5%. The cell was quite stable under prolonged illumination. On subjecting the cell to a 90-hour exposure to simulated Air-Mass-2 illumination, the cell reached a steady state efficiency of 0.23 to 0.25 percent, with no evidence of further degradation.

EXAMPLE 23

A cell was fabricated as described for Example 1, but the dye used was the following:

The cell had a Voc=0.500 V, Isc=0.2 mA/cm², a fill factor of 0.28, a conversion efficiency of 0.05 percent and a quantum efficiency of 0.83%.

EXAMPLE 24

Example 1 was repeated, except that the dye used was the following:

The cell had a Voc of about 0.5 V, an Isc of about 0.24 mA/cm², a fill factor of about 0.34, and a conversion efficiency of about 0.05 percent and a quantum efficiency of 1%.

EXAMPLES 25 THROUGH 27

Cells were fabricated as described for Example 1, except that dyes of the following structure were used:

wherein φ=phenyl.

Table IV lists the output of these cells for various substitutions at Q, X, and R.

TABLE IV

| Example | Q | X | R | Voc (volts) | Isc (mA/cm²) | Conversion Efficiency, % | Quantum Eff., % |
|---|---|---|---|---|---|---|---|
| 25 | S | S | CH₃ | 0.25 | 0.4 | 0.036 | 1.66 |
| 26 | O | O | C≡N | 0.4 | 0.4 | 0.066 | 1.66 |
| 27 | O | O |  | 0.44 | 0.28 | 0.05 | 1.15 |

EXAMPLE 28

A photovoltaic element was prepared and tested as described in Example 1, except that the dye layer, at a thickness of about 400 Å, was comprised of:

This element was found to have a Voc of about 0.52 V, an Isc of about 1 mA/cm², and a fill factor of 0.40, producing a conversion efficiency of about 0.27 percent and a quantum efficiency of 4.2%.

EXAMPLES 29-36

A photovoltaic element was prepared and illuminated for each of these examples in the manner described for Example 1, except that acceptor compounds of the structure wherein $R^7$ and $R^8$ were as designated in Table V, were used in place of photoconductive dye of Example 1, and a silver electrode was used in place of indium. Table V sets forth the resulting solar cell properties.

TABLE V

| Example | $R^7 = R^8$ | Voc. (mV) | Isc (mA/cm²) | Fill Factor | Conversion Efficiency (%) | Quantum Efficiency (%) |
|---|---|---|---|---|---|---|
| 29 | —CH₃ | 385 | 1.93 | 0.55 | 0.55 | 8.0 |
| 30 | —⌬ | 440 | 3.0 | 0.6 | 1.0 | 1.25 |
| 31 | —⌬—CH₃ | 330 | 1.5 | 0.48 | 0.32 | 6.24 |
| 32 | —⌬—OC₂H₅ | 400 | 1.4 | 0.52 | 0.4 | 5.82 |
| 33 | H | 330 | 1.65 | 0.50 | 0.36 | 6.86 |
| 34 | —⌬—Cl | 280 | 1.1 | 0.44 | 0.2 | 4.57 |
| 35 | (quinolyl) | 530 | 0.5 | 0.31 | 0.1 | 2.0 |
| 36 | —CH₂CH₂CH₂—OH | 420 | 1.34 | 0.45 | 0.34 | 5.57 |

EXAMPLES 37-40

Cells were prepared and illuminated as described in Examples 29-36, except that the acceptor material was the compound identified in Table VI for each respective example. The results are given in Table VI.

TABLE VI

| Example | Compound | Voc (mV) | Isc (mA/cm²) | Fill Factor | Conversion Efficiency (%) | Quantum Efficiency (%) |
|---|---|---|---|---|---|---|
| 37 | (structure) | 490 | 1.7 | 0.57 | 0.65 | 7.1 |
| 38 | (structure) | 480 | 0.8 | 0.17 | 0.1 | 3.3 |
| 39 | (structure) | 530 | 1.00 | 0.34 | 0.24 | 4.1 |

TABLE VI-continued

| Example | Compound | Voc (mV) | Isc (mA/cm$^2$) | Fill Factor | Conversion Efficiency (%) | Quantum Efficiency (%) |
|---|---|---|---|---|---|---|
| 40 | (mixture of two isomeric perylene bis-benzimidazole structures) | 450 | 1.7 | 0.61 | 0.66 | 7.1 |

In certain of the above examples, the cells so prepared were initially shorted, i.e., the Ag electrode was in contact with the Nesatron electrode through pinholes in the organic layer. These cells were and can be "recovered" simply by applying a large transient current through the cell which effectively burns out the shorts. This was done by shorting the cell momentarily with a 22-volt battery.

EXAMPLE 41

For this example, a cell as described in Example 1 was prepared and illuminated, except that in place of phthalocyanine, ovalene was used, Ag was used in place of indium, and each of the donor and acceptor layers was about 500 Å thick. The resulting cell had a conversion efficiency of about 0.1%.

EXAMPLE 42

A cell was prepared and illuminated as described in Example 41, except that the donor material was diindeno[1,2,3-cd-1',2',3'-1m]perylene of the acceptor material was flavanthrone. The resulting cell had a Voc=825 mV, Isc=0.8 mA/cm$^2$ fill factor=0.51, and a conversion efficiency=0.46% and a quantum efficiency of 3.3%.

EXAMPLE 43

A cell was prepared and illuminated as described for Example 1, except that the acceptor material was a pyrylium dye of the structure and the top electrode was silver instead of indium. The open-circuit voltage was 0.36 volt, the short-circuit current was 0.96 mA/cm$^2$, the fill factor was 0.33, the power conversion efficiency was 0.15% and the quantum efficiency was about 4%.

COMPARATIVE EXAMPLES

C. E. No. 1: Inadequate Donor-Like Compounds

Coronene, a fused seven-ring carbocyclic compound, was used as the electron donor material in a cell prepared as described in Example 1 in place of the porphyrinic compound. The resulting cell was inoperative due to permanent shorts that were present through the coronene layer. The cell did not produce a measurable conversion efficiency. Its quantum efficiency was essentially zero.

C.E. Nos. 2-7

Solar cells were prepared and illuminated as described in Example 1, with the exceptions noted hereafter, and in place of the acceptor dye therein described, certain materials listed in Table VII were used to form the layer contacting the copper phthalocyanine.

TABLE VII

| C.E. | Compound | Voc (mV) | Isc (mA/cm$^2$) | Fill Factor | Conversion Efficiency (%) | Quantum Efficiency (%) |
|---|---|---|---|---|---|---|
| 2 | Malachite green* | 550 | 0.1 | 0.22 | 0.015 | 0.42 |
| 3 | Crystal violet* | 10-15 | 0.04-0.05 | 0.25 | $5 \times 10^{-4}$ | 0.19 |
| 4 | Rhodamine B* | 680 | 0.055 | 0.37 | 0.018 | 0.23 |
| 5 | tetraphenyl p-phenylenediamine* | 4 | 0.01 | | negligible | 0.04 |
| 6 | (bis-indoline structure with Cl$^\ominus$) | 190 | 0.07 | 0.25 | $4 \times 10^{-3}$ | 0.03 |

TABLE VII-continued

| C.E. | Compound | Voc (mV) | Isc (mA/cm²) | Fill Factor | Conversion Efficiency (%) | Quantum Efficiency (%) |
|---|---|---|---|---|---|---|
| 7 |  ⊖p-tolyl-sulfonate | 150 | 0.05 | 0.25 | $2.5 \times 10^{-3}$ | 0.02 |

*For these examples, Ag was used in place of the indium electrode.

The copper phthalocyanine/tetraphenyl p-phenylenediamine two layer system yielded almost zero output. The cell was not shorted; rather the internal resistance was on the order of $10^6$ ohm. It is expected that tetramethyl p-phenylenediamine (air oxidized) would behave similarly to the tetramethyl derivative.

C.E. Nos. 8-10

Cells were prepared as described in C.E. Nos. 2-7, except that anthraquinone, and different anthraquinone derivatives containing 4 or 6 fused rings, respectively, were used as electron-acceptor compounds. In all cases, the cells were completely shorted. These examples demonstrated the preference, in the case of fused electron-acceptor compounds, for at least 7 aromatic rings in the nucleus. Compounds with 6 or less rings have a surface area, measured in a plane, of less than about 40 square angstroms.

The invention has been described in detail with particular reference to certain preferred embodiments thereof, but it will be understood that variations and modifications can be effected within the spirit and scope of the invention.

What is claimed is:

1. A photoconductive laminate comprising
  a single-phase layer of an organic electron-donor compound containing a generally planar polycyclic nucleus,
  and in contact with said layer, a single-phase layer of a photoconductive organic dye having the structure wherein:
J is or N;

$D^1$ and $D^2$ are the same or different and are each the non-metallic atoms necessary to complete a heterocyclic 6-membered ring containing O, S, or Se as a ring atom;

$R^8$, $R^9$ and $R^{10}$ are the same or different and are each H, alkyl from 1 to about 3 carbon atoms, aryl, cyano or nitro;

$R^1$, $R^2$, $R^3$ and $R^4$ are the same or different and are each phenyl, or alkyl or alkoxy containing from 1 to about 5 carbon atoms, at least two of $R^1$, $R^2$, $R^3$ and $R^4$ being phenyl;

m is 1 or 0 and is 0 if J is N;

and $Z^\ominus$ is an anion.

2. A laminate as defined in claim 1, wherein said due has the structure wherein Q and X are the same or different and are each O, S, or Se.

3. A photoconductive laminate comprising
  a single-phase layer of an organic electron donor compound containing a generally planar polycyclic nucleus,
  and in contact with said layer, a single-phase layer of a photoconductive organic dye having the structure:

in which $R^5$ and $R^6$ are the same or differnt and are each alkyl from 1 to about 6 carbon atoms, phenyl, or a 5 or 6-membered heterocyclic ring;

$R^7$ represents an alkylamino-substituted phenyl or an alkylamino-substituted 5 or 6-membered heterocyclic ring having from 1 to about 6 carbon atoms in the alkyl moiety;

X is oxygen, selenium or sulfur; and $Z^{8\ominus}$ is an anion.

4. A laminate as defined in claim 1 or 3 and further including a layer of metal operatively connected to at least one of said layers, said metal being selected to make an ohmic contact with said one layer.

5. A laminate as defined in claim 1 or 3, wherein said dye is a thiapyrylium dye.

6. A laminate as defined in claim 1 or 3, wherein said donor compound has a surface area in the plane of the compound, on one side of the compound, of at least 40 square angstroms, and a width in the plane of at least about 5 angstroms.

7. A laminate as defined in claim 1 or 3, wherein said layers have a total thickness of no greater than about 0.5 microns.

* * * * *

UNITED STATES PATENT AND TRADEMARK OFFICE
CERTIFICATE OF CORRECTION

PATENT NO. : 4,281,053
DATED : July 28, 1981
INVENTOR(S) : Ching W. Tang

It is certified that error appears in the above-identified patent and that said Letters Patent are hereby corrected as shown below:

In the Heading, the title "MULTILAYER ORGANIC PHOTOVOLTAIC ELEMENTS", should read --MULTILAYER PHOTOCONDUCTIVE LAMINATE--.

Col. 22, line 39 (Claim 2), "due", should read --dye--.

Signed and Sealed this

Sixteenth Day of March 1982

[SEAL]

Attest:

GERALD J. MOSSINGHOFF

Attesting Officer        Commissioner of Patents and Trademarks